United States Patent
Wado et al.

(10) Patent No.: US 6,450,025 B1
(45) Date of Patent: Sep. 17, 2002

(54) MICRO-HEATER AND AIRFLOW SENSOR USING THE SAME

(75) Inventors: Hiroyuki Wado, Toyota; Yoshinori Otsuka, Okazaki; Eishi Kawasaki, Kuwana, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/499,020

(22) Filed: Feb. 4, 2000

(51) Int. Cl.$^7$ ................................................. G01F 1/68
(52) U.S. Cl. ................................................... 73/204.26
(58) Field of Search ..................... 73/204.26, 204.17, 73/204.19, 204.11, 204.23

(56) References Cited

U.S. PATENT DOCUMENTS

| | | | | |
|---|---|---|---|---|
| 4,501,144 A | * | 2/1985 | Higashi et al. | .......... 73/204.26 |
| 4,651,564 A | * | 3/1987 | Johnson et al. | .......... 73/204.26 |
| 4,682,503 A | * | 7/1987 | Higashi et al. | ............... 73/755 |
| 4,829,814 A | * | 5/1989 | Suzuki et al. | ............. 73/118.2 |
| 5,406,841 A | | 4/1995 | Kimura | |
| 5,423,212 A | * | 6/1995 | Manaka | ................... 73/204.26 |
| 5,652,443 A | | 7/1997 | Kasai | |

FOREIGN PATENT DOCUMENTS

| | | | |
|---|---|---|---|
| JP | 2-193019 | 7/1990 | |
| JP | 4-72523 | 3/1992 | |
| JP | B2-4-74672 | 11/1992 | |
| JP | B2-6-68451 | 8/1994 | |
| JP | 7-174600 | 7/1995 | |
| JP | 11271123 | * 10/1995 | ............. G01F/1/68 |
| JP | B2-2518352 | 5/1996 | |
| JP | 9-243423 | 9/1997 | |
| JP | 11-194043 | 7/1999 | |
| JP | 11-271123 | 10/1999 | |

OTHER PUBLICATIONS

Wado, et al., "Analysis of Heat Transfer in Micro–Bridge Heater," *Report of Institute of Electrical Engineers of Japan*, Mar. 1999, pp. 6–12.

* cited by examiner

*Primary Examiner*—Benjamin R. Fuller
*Assistant Examiner*—Andre Allen
(74) *Attorney, Agent, or Firm*—Law Offices of David G. Posz

(57) ABSTRACT

An airflow sensor including a micro-heater having a film structure, which can reduce a warpage of the film structure even when a thick ness of the film structure to improve a mechanical strength thereof. An airflow sensor is provided with a monocrystalline silicon substrate having a hollow portion therein; a thin film heater portion as a micro-heater arranged above the hollow portion; and a temperature sensor. The thin film heater portion has a laminated structure of a lower thin film, a heater layer, and an upper thin film. The lower and the upper thin film respectively have a tensile stress film and a compressive stress film laminated with the tensile stress film, and are symmetry laminated with respect to the heater layer. The tensile stress film is made up of a $Si_3N_4$ film having a great moisture-proof characteristic; and the compressive stress film is made up of a $SiO_2$ film having a great adhesion. Since these stress films cancel their internal stress each other, the internal stress can be released, and a warpage moment can be cancelled so that a warpage of the whole film structure can be restricted. Therefore, the mechanical strength can be improved even if the thickness of the film is increased.

22 Claims, 5 Drawing Sheets

MICRO-HEATER AND AIRFLOW SENSOR USING THE SAME

CROSS REFERENCE TO RELATED APPLICATION

This application is based upon Japanese Patent Application No. Hei. 10-72082 filed on Mar. 20, 1998, the contents of which are incorporated herein by reference.

BACKGROUND OF THE INVENTION

1. Field of the Invention

This invention relates to micro-heaters, and particular to a micro-heater having a thin film heater portion being bridged over a hollow portion formed in a substrate, manufacturing the same, and an airflow sensor using the same.

2. Related Art

Recently, an airflow sensor or a humidity sensor formed on a semiconductor chip has been developed. A micro-heater, which is necessary during detection, is provided in this structure. In this case, the micro-heater has a thin film structure of several micrometers in thickness in order to prevent heat from releasing to a substrate during an increase in temperature, and further has a thermal insulating structure such as through holes provided in the thin film structure. In addition, the size of the micro-heater is reduced so that thermal responsiveness and power consumption are reduced.

In general, the thin film structure applied to the micro-heater has a structure in which a heater material is sandwiched by a pair of protection films. Here, the heater material is made of a conductive material such as platinum (Pt), silicon (Si), nickel chrome (NiCr), tantalum nitride (TaN), silicon carbide (SiC), or tungsten (W). The protection film is made of an insulating material thin film such as magnesium oxide (MgO), silicon dioxide ($SiO_2$), silicon nitride ($Si_3N_4$), tantalum oxide ($Ta_2O_5$), or aluminum oxide ($Al_2O_3$).

However, in a conventional film structure, a distribution of internal stress in the structure is generally not adjusted during a room temperature and rising temperature. Therefore, the structure may be deformed to warp in a convex (domed-shape) or a concave (dished-shape) manner due to the internal stress generated in such a way and that remains in the structure. The warpage is further changed due to a difference of thermal expansion coefficients of each material in accordance with temperature changes of the strucuture. As a result, thermal stress is generated in the structure. In this case, a cold cycle is repeatedly substantially applied to the film structure during turning on or turning off of a power supply or during intermittent operation, and it may decrease the reliability of the film structure and the heater portion.

A countermeasure to prevent a decrease in reliability due to the thermal stress has been proposed in JP-A-8-107236. According to this countermeasure, the heater material is sandwiched by an upper film and a lower film having the same material as that of the upper film. The thermal stress is decreased by compensating for the stress generated by expansion and contraction of the upper and the lower heater material by according (equalizing) thermal coefficients of the upper and the lower heater material. It can enhance an effect of decreasing the thermal stress by according thickness of the upper and the lower heater material. The heater material made of platinum (Pt) is set to 0.5 $\mu$m, and the thickness of upper film and the lower film both of which are made of tantalum oxide ($Ta_2O_5$) are set to 1.25 $\mu$m.

However, this structure may also decrease the reliability of the film structure due to the internal stress of the film structure itself, when the thickness of the film is increased for the purpose of increasing mechanical strength. In the case where a compressive stress film is applied, a buckling phenomenon may occur as the internal stress increases. To the contrary, in the case where a tensile stress film is applied, cracks may occur in the film as the internal stress increases.

However, this structure may also decrease the reliability of the film structure due to the internal stress of the film structure itself, when the thickness of the film is increased for the purpose of increasing a mechanical strength. In the case where a compressive stress film is applied, a bucking phenomenon may occur as the internal stress increases. On the contrary, in the case where a tensile stress film is applied, cracks may occur in the film as the internal stress increases.

Furthermore, in the case where the upper film and the lower film are made of $Ta_2O_5$ or $Al_2O_3$, the upper film and the lower film may be easily changed to poly crystalline film during high temperature thermal process (anneal) of for the purpose of increasing a characteristic of the heater material. Here, since the internal stress of the poly crystalline is different from each other depending on crystal grain sizes, the internal stress may be influenced by the thickness and a manufacturing method, and therefore it is difficult to control the internal stress. Furthermore, since the internal stress may not be uniformly generated in the film itself, it is difficult to control the warpage based on stress previously calculated.

SUMMARY OF THE INVENTION

This invention has been conceived in view of the background thus far described and its first object is to reduce a warpage of a film structure to improve durability for thermal stress by structurally adjusting an internal stress generated during fabrication or thermal process.

Its second object is to enable to freely change a thickness of the film structure by adjusting the internal stress.

Its third object is to improve a mechanical strength of the film structure.

Its fourth object is to reduce a warpage of a film structure even when a thickness of the film structure to improve a mechanical strength thereof.

According to the present invention, a micro-heater comprises a thin film heater portion including: a heater layer; a first thin film laminated with one surface side of the heater layer, and formed by laminating a plurality of films including a compressive stress film and a tensile stress film; and a second thin film laminated with another surface side of the heater layer so as to sandwich the heater layer with the lower thin film, and formed by laminating a plurality of films including a compressive stress film and a tensile stress film. Here, the compressive stress film and the tensile stress film of the first thin film and the compressive stress film and the tensile stress film of the second thin film are provided so that an internal stress of the thin film heater portion is released. According to this structure, a warpage stress due to an expansion or compression of the heater layer can be released, and it can prevent reliability of the thin film heater portion from decreasing even when the thickness each film is increased for the purpose of increasing the mechanical strength. Therefore, it can improve durability for a thermal stress with reducing the warpage.

According to another aspect of the present invention, one of the first thin film has an internal stress for warping the thin film heater portion in a domed-shape, and another of the first thin film has an internal stress for warping the thin film heater portion in a dished-shape. Furthermore, each of the first thin film and the second thin film respectively has a film structure so that the internal stress for warping the thin film heater portion in the domed-shape and the internal stress for warping the thin film heater portion in the dished-shape are cancelled each other. According to this structure, an amount of warpage of the heater layer itself due to the internal stress can be reduced when if the internal stress is changed in accordance with temperature changes of the heater layer, because the heater layer is laminated at the substantially center portion of the thin film heater portion. Furthermore, it can prevent the thin film heater portion from warping to one side, because the internal stress for warping the thin film heater portion in a domed-shape and the internal stress for warping the thin film heater portion in a dished-shape will be cancelled.

According to far another aspect of the present invention, the substrate is annealed before forming the heater layer at a temperature equal to or higher than a highest temperature used in another annealing process to be conducted after forming the heater layer; or the substrate is annealed before forming the second layer at a temperature equal to or higher than a highest temperature used in another annealing process to be conducted after forming the second layer. By employing this process, it can prevent an internal stress newly generated at another annealing process before forming a next film from generating.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

DESCRIPTION OF THE PREFERRED EMBODIMENTS

Here, a preferable embodiment in which the present invention is applied to an airflow sensor will be explained with reference to the accompanying drawings. In this case, the airflow sensor is to be provided to a portion where an amount of intake of an internal combustion engine such as vehicle or shipboard is to be detected.

Figure 1:
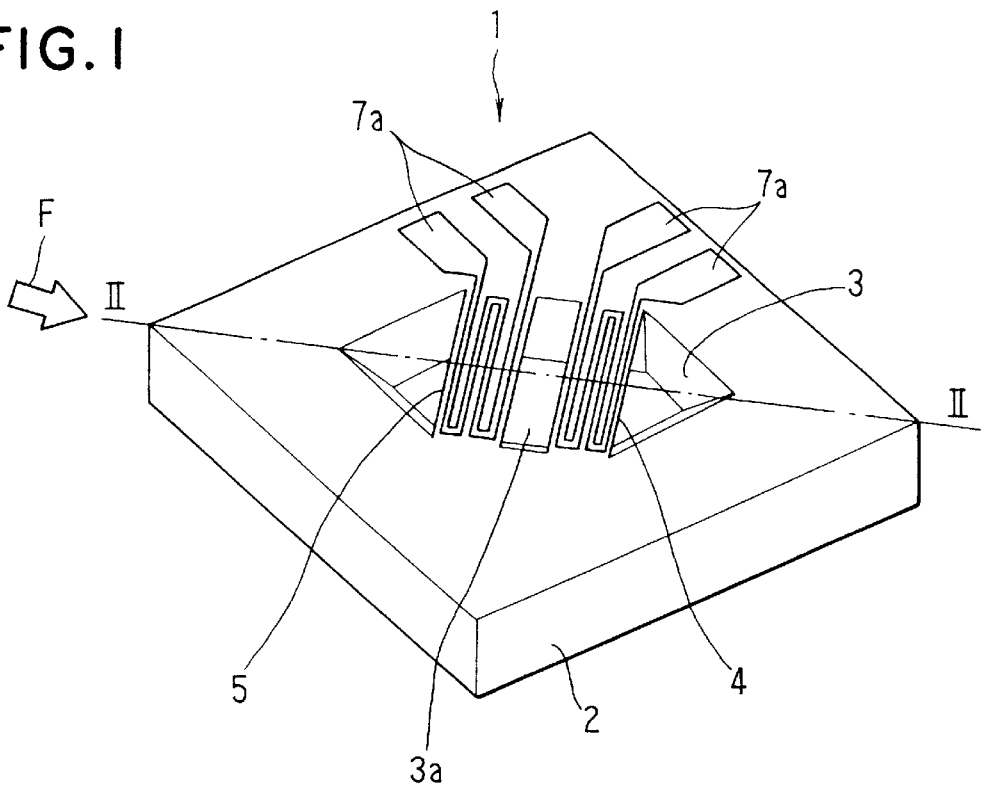
FIG. 1 is a perspective view of an airflow sensor of an embodiment according to the present invention.
Figure 2:
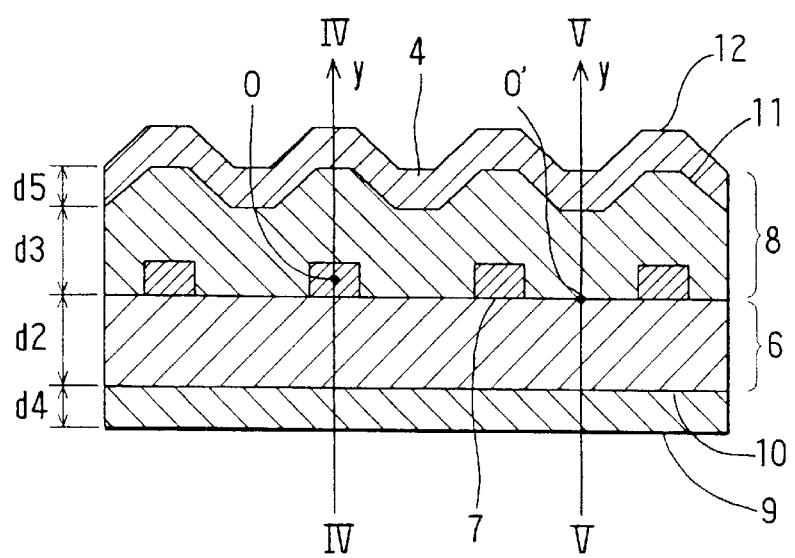
FIG. 2 is a sectional view taken along a line II—II in FIG. 1.
Figure 3:
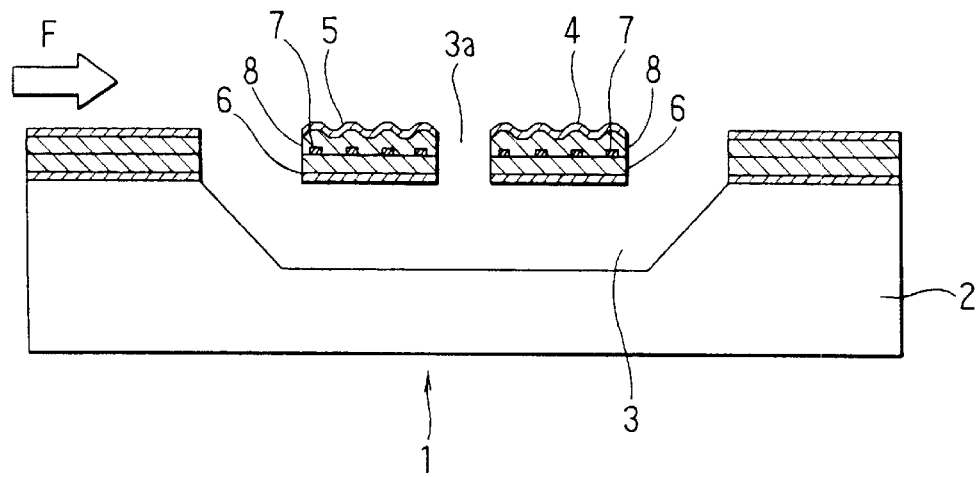
FIG. 3 is an enlarged partial sectional view of FIG. 2.

FIG. 1 shows a perspective view of the airflow sensor 1 including a micro-heater having a bridge-type structure. FIG. 2 is a sectional view taken along a line II—II in FIG. 1. FIG. 3 is an enlarged partial sectional view of FIG. 2.

As shown in FIG. 1, at a center portion of a monocrystalline silicon substrate 2 having a rectangular shape as a substrate, a hollow portion 3 made up of a longitudinal-shape depression portion along to a diagonal direction is formed at a surface side. A thin film heater portion 4 and a temperature sensor 5, both of which are made up of thin film, are provided in parallel with each other to the hollow portion 3 so as to be bridged over the hollow portion 3 along to a width direction with a slit portion 3a interposed therebetween.

The thin film heater portion 4 as the micro-heater applies the same film structure as that of the temperature sensor 5, and has a laminated structure in which a lower thin film 6, a heater layer 7 as a heater film and an upper thin film 8 are laminated in this order, as shown in FIGS. 2, 3. In each of the thin film heater portion 4 and the temperature sensor 5, the heater layer 7 is formed by forming platinum (Pt) film having a thickness of, for example, 200 nm, and by patterning so that the Pt film continuously returns by two times (parallel W-shaped) along to the width direction of the hollow portion 3. Each of the heater portions 7 has a pair of electrode pads 7a at its two terminal portions located at a peripheral portion on a surface of the monocrystalline silicon substrate 2. As described later, the heater layer 7 is formed so that a thinner titanium (Ti) layer as a bonding layer (e. g., thickness of 5–10 nm) is inserted between the lower thin film 6 and the upper thin film 8 so as to enhance an adhesion therebetween.

FIG. 3 schematically shows a section of the thin film heater portion 4, which has the same structure as that of the temperature sensor 5. The heater layer 7 is divided into four pattern portions, and is held by sandwiched by the lower thin film 6 and the upper thin film 8. Each of the lower thin film 6 and the upper thin film 8 are made up of two laminated layers, and are symmetry arranged with respect to the heater layer 7.

In other words, the lower thin film 6 is formed in a laminated structure made up of a silicon nitride film ($Si_3N_4$ film) 9 having a thickness of approximately 0.15 $\mu$m as a tensile stress film arranged lower side, and a silicon dioxide film ($SiO_2$ film) having a thickness of approximately 1.0 $\mu$m as a compressive stress film arranged upper side (a side contacts with the heater layer 7). The upper thin film 8 is formed in a laminated structure made up of a silicon nitride film ($Si_3N_4$ film) 9 having a thickness of approximately 0.15 $\mu$m as a tensile stress film arranged upper side, and a silicon dioxide film ($SiO_2$ film) having a thickness of approximately 1.0 $\mu$m as a compressive stress film arranged lower side where the heater layer 7 is contacted. Therefore, the lower thin film 6 has the same kind material and the same thickness as those of the upper thin film 8 so as to symmetry arranged with respect to the heater layer 7.

The airflow sensor 1 constructed in this way is mounted in a not-shown intake pipe connected to an internal combustion engine of a vehicle or a shipboard or the like in order to detect an amount of intake to be conducted to the internal combustion engine. In this case, the airflow sensor 1 is arranged so that stream of air to be detected is set to a direction indicated by an arrow F in FIG. 1 or 2.

A detection of the intake airflow is performed as follows. When the air is flowed along to the direction of the arrow F, a temperature T of the air is detected by the temperature sensor 5. A power is supplied to the thin film heater portion 4 so that the thin film heater 4 keeps a certain temperature higher than the temperature T of the detected air by a predetermined temperature $\Delta T$. Here, since an amount of heat radiated from a surface of the thin film heater portion 4 is changed depending on the amount of air flowed along the surface of the thin film heater portion 4. The amount of intake airflow can be detected by detecting electrical current supplied to the thin film heater portion 4.

Here, in the case where the detection is performed, the temperature of the thin film heater portion 4 is risen to some hundreds degree centigrade by using the heater. layer 7. In other words, the temperature of the thin film heater portion 4 abruptly rises and abruptly falls repeatedly. Hence, the heater layer 7 as the conductive material layer is largely expanded and contracted in accordance with temperature changed with respect to the lower thin film 6 and the upper thin film 8. As a result, stress distortion is generated between the heater layer 7 and the lower thin film 6, and between the heater layer 7 and the upper thin film 8; the thin film heater portion is warped; and thermal stress is generated. According to this embodiment, since the lower thin film 6 and the upper thin film 8 are constructed as the above-described structure, it can prevent harmful influence due to the thermal stress.

Operations of the present invention will be explained hereinafter. Here, products of distance in a thickness direction with respect to a center of the film structure (the heater layer 7) and internal stress generated therein are considered (distance×internal stress). It is assumed that the products of the distance and the internal direction act on the thin film heater portion 4 as a stress for warping the thin film heater portion 4 in a domed-shape or a stress for warping the thin film heater portion 4 in a dished-shape. These stresses will be explained hereinafter by using a warpage moment model.

Figure 4A:
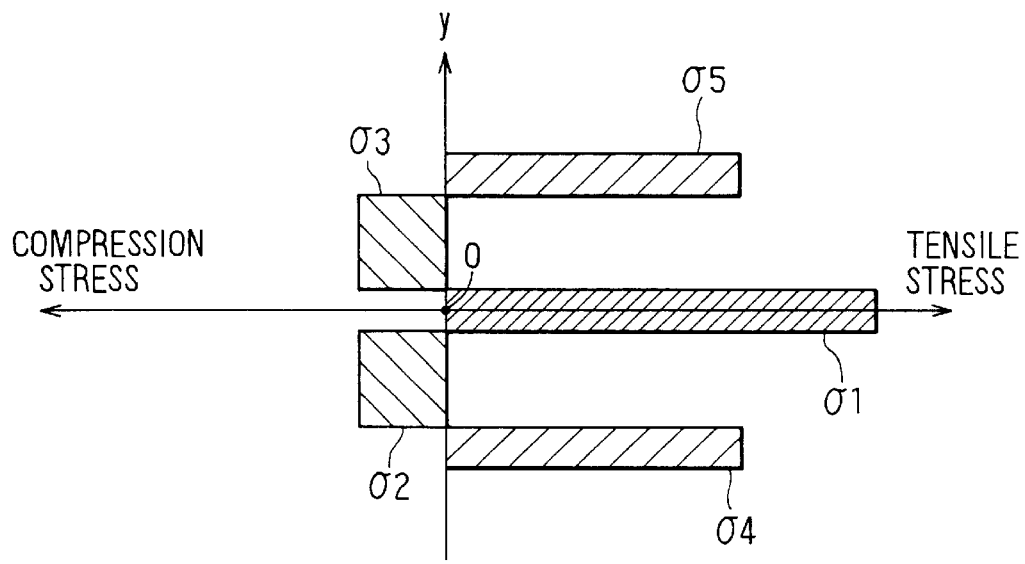
FIGS. 4A and 4B are diagrams respectively illustrating relationships between an internal stress and a warpage moment taken along a line IV—IV in FIG. 3.
Figure 4B:
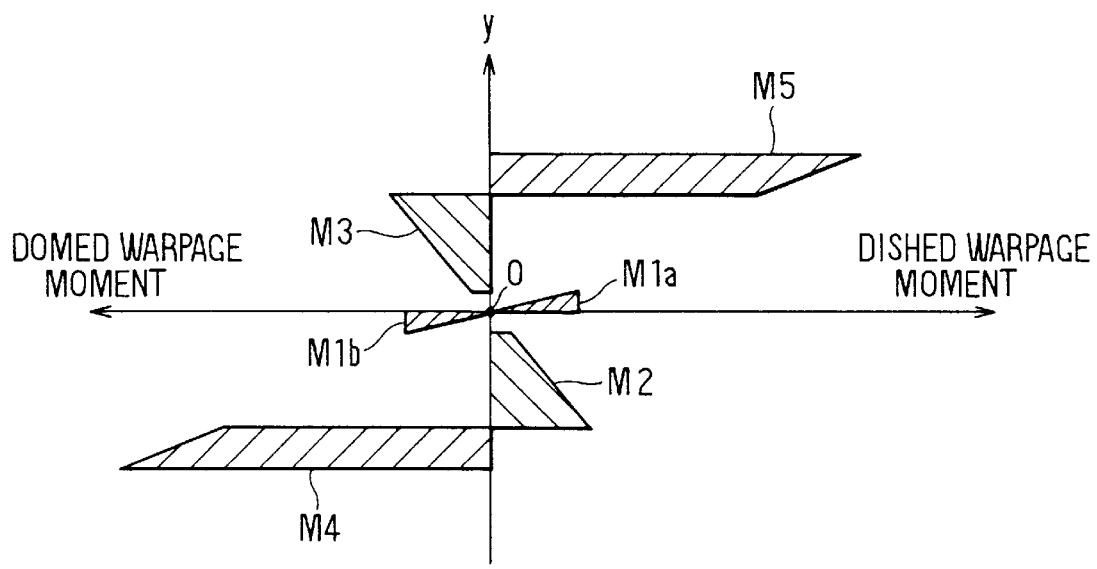
Figure 5A:
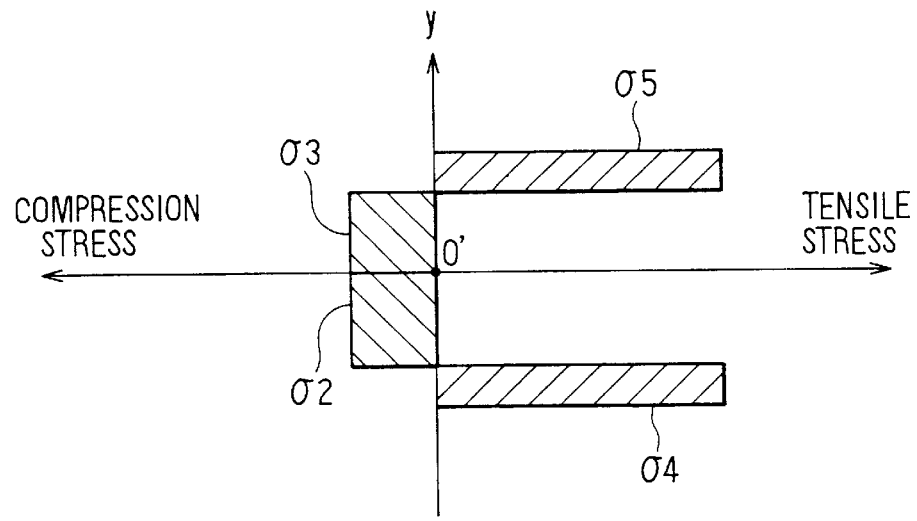
FIGS. 5A and 5B are diagrams respectively illustrating relationships between an internal stress and a warpage moment taken along a line V—V in FIG. 3.
Figure 5B:
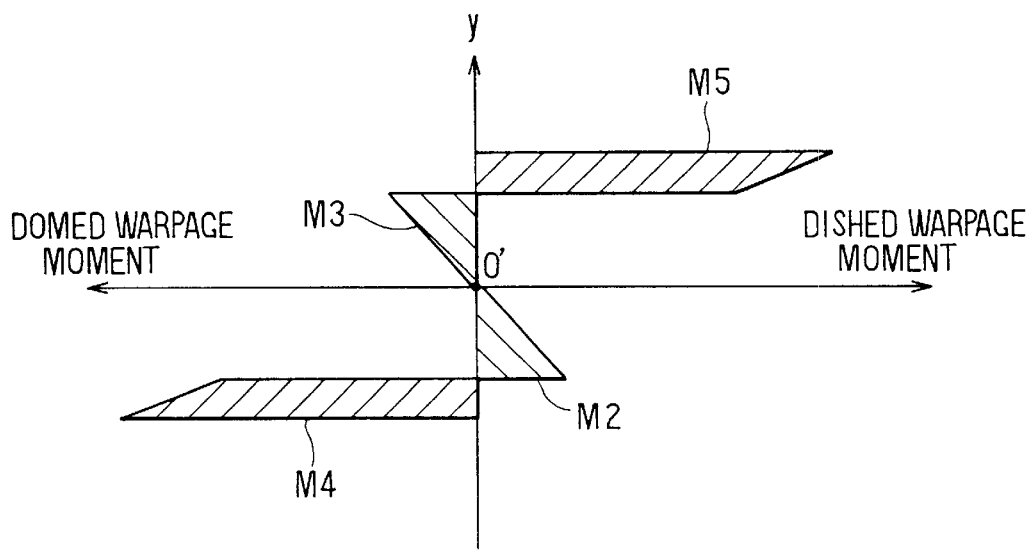

FIGS. 4A, 4B, 5A and 5B respectively show distributions of the distance y with respect to the thickness direction (y-direction) and the internal stress σ generated at corresponding positions, and distributions of the distance y with respect to the thickness direction (y-direction) and the warpage moment M generated at corresponding positions. In other words, FIGS. 4A and 4B show the internal stress σ in the thickness direction and the warpage moment M at the portion where the heater layer 7 is included; and FIGS. 5A and 5B show those at the portion where the heater layer 7 is not included.

As shown in FIGS. 4A and 4B, since the heater layer 7 generally employs a deposited conductive material, a large tensile stress σ1 exists therein as the internal stress. Furthermore, since the heater layer 7 largely expands or contracts in accordance with the temperature due to a material characteristic, the internal stress also largely changes in accordance with the temperature changes. However, when the heater layer 7 is considered as the whole film structure, the heater layer 7 is substantially located at a center portion O. Therefore, the distance y in the thickness direction (y-direction) from the center portion is sufficiently small. Now, the warpage moment M acted as a force for warping entire thin film structure is defined by product of the internal stress σ and the distance y from the center portion. Concretely, a value of the warpage moment M is calculated by integrating the products of the distance y from the center portion and the internal stress Δσ at the position along the y-direction.

As shown in FIG. 4B, the warpage moment M1 of the heater layer 7 can be considered as very small value because the distance y from the center portion O is short. The upper half of warpage moment M1 of the heater layer 7 upper than the center portion O acts as a dished warpage moment M1*a*, and lower half of warpage moment M1 of the heater layer 7 lower than the center portion O acts as a domed warpage moment M1*b*. Since the dished warpage moment M1*a* and the domed warpage moment M1*b* have the same values each other, these are compensated each other, and the moment for warping the film structure of the thin film heater portion 4 is substantially cancelled. Therefore, even when the heater layer 7 expands or contracts in accordance with the temperature changes, it can prevent the warpage moment from generating due to the internal stress generated in the heater layer 7. In other words, the warpage moment can be extremely reduced even when a stress distribution of the heater layer 7 is not uniform, by arranging the heater layer 7 at the substantially center portion O.

On the contrary, since the lower thin film 6 and the upper thin film 8 located at the lower side and at the upper side of the heater layer 7 are formed by laminating the $Si_3N_4$ films 9, 14 as the tensile stress film and the $SiO_2$ films 10, 11 as the compressive stress film, the internal stress acted as the whole is released by internal stresses being acted each other. For example, the lower thin film 6 and the upper thin film 8 may be formed so that each of the films 6, 8 has a small internal stress enough to prevent breakage during normal operation temperature range. From a practical point of view, it is preferable to set the internal stress to a small tensile stress having 10 MPa to 200 MPa during the normal operation temperature range, for example.

Now, a stress σA acted on the entire lower thin film 6 and a stress σB acted on the entire upper thin film 8 are considered. When each internal stress in each of the $SiO_2$ films 10, 11 and the $Si_3N_4$ films 9, 14 is defined as σ2, σ3, σ4, σ5, and each thickness of each of the $SiO_2$ films 10, 11 and the $Si_3N_4$ films 9, 14 is defined as d2, d3, d4, d5, the stresses σA and σB are shown as follows.

$$\sigma A = (\sigma 2 \times d2 + \sigma 4 \times d4)/(d2+d4)$$

$$\sigma B = (\sigma 3 \times d3 + \sigma 5 \times d5)/(d3+d5)$$

Therefore, in the lower thin film 6 and the upper thin film 8, which are combined by the compressive stress film and the tensile stress film, the internal stresses σA and σB indicated by the above-described equations are clearly reduced compared to the case where the internal stress exists only one side.

Here, in the case of this embodiment, the $Si_3N_4$ films 9, 14 have tensile stress of approximately 1200 MPa, for example; the $SiO_2$ films 10, 11 have compressive stress of approximately 150 MPa; and each thickness d2, d3, d4, d5 is 0.15, 0.15, 1.0, 1.0, respectively. When the internal stresses σA and σB are calculated by substituting the above-described values into the equations, both tensile stresses are σA=σB=26 MPa.

This value complies with a condition for releasing the internal stress described the above. Since actually measured data is approximately 30 MPa, it is found that actual internal stress is substantially equal to the calculated value. Furthermore, since the lower thin film 6 and the upper thin film 8 have the same thickness and the same distance from the center portion O each other, and since components acted as the warpage moments are equal each other and have opposite direction, the warpage moments M2, M3, M4, M5 of each of the internal stresses σ2, σ3, σ4, σ5 are calculated as in FIG. 4B. Here, each strength of the moments are M2=−M3 and M5=−M4.

In each of the lower thin film 6 and the upper thin film 8, one of the MA and MB becomes the domed warpage moment, and another of the MA and MB becomes the dished warpage moment having substantially the same value as that of the one of the MA and MB. Concretely, the moments M3, M4 and M1*b* act as the domed warpage moment, and the moments M2, M5 and M1*a* act as the dished warpage moment. The moment MA of the lower thin film 6 and the moment MB of the upper thin film 8 are calculated as follows.

$$MA=M2+M4 \quad MB=M3+M5$$

Therefore, the moment for causing warpage to one side is cancelled by being compensated each other when it is considered as the whole of the thin film heater portion 4; and both the warpage due to the internal stress at room temperature and the warpage due to the temperature changes are almost cancelled.

Furthermore, in such a condition, it can be considered in the same way at the portion where the heater layer 7 does not exist. As shown in FIGS. 5A and 5B, the internal stress and the warpage moment can be calculated. Hence, it can prevent the warpage of the entire thin film heater portion 4.

Next, a manufacturing method of the airflow sensor 1 will be explained with reference to FIGS. 6A to 6E.

Figure 6A:
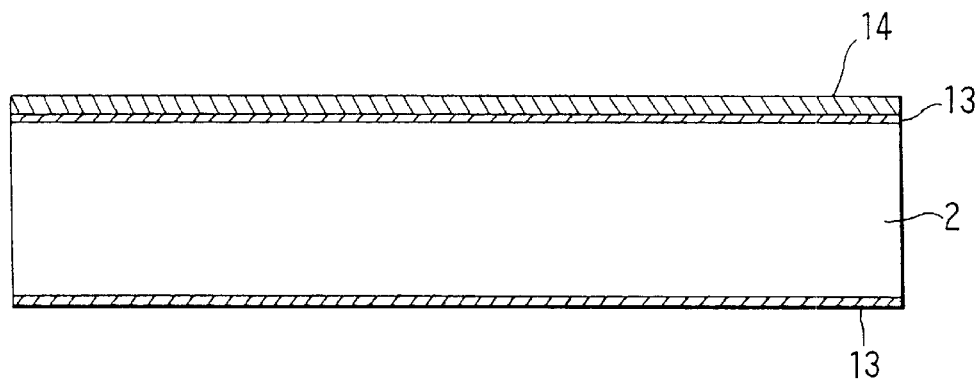
FIGS. 6A to 6E are sectional views respectively illustrating manufacturing steps.

At first, as shown in FIG. 6A, a $Si_3N_4$ film 13 having a thickness of approximately 0.15 μm is deposited on a surface of the monocrystalline silicon substrate 2 by LPCVD. During this deposition, a heating temperature or a substrate temperature of the monocrystalline silicon substrate 2 is kept to 750° C. Next, the $SiO_2$ films having a thickness of approximately 1.0 μm is deposited on a surface of the $Si_3N_4$ film 13 by plasma CVD. During this deposition, the substrate temperature of the monocrystalline silicon substrate 2 is kept to 200° C.

It should be noted that since a film quality of the $SiO_2$ film 14 formed by the plasma CVD may be unstable, a high temperature thermal process (anneal) is performed after forming the $SiO_2$ film 14. Here, the thermal process is performed under nitrogen atmosphere for a predetermined time. Temperature of the thermal process is set a predetermined temperature, which is the same as that of a thermal process performed later, that is approximately 750° C. This temperature condition can prevent the internal stress of the $SiO_2$ film 14 from changing during another thermal process performed later.

Here, the reason for forming the $Si_3N_4$ film 13 as the tensile stress film and forming the $SiO_2$ film 14 as the compressive stress film is that these films are conventionally used in a silicon-based manufacturing process and that these films are amorphous materials. The film can be also selected from a group of $TiO_2$, $Al_2O_3$, $Ta_2O_5$, MgO, or the like. The compressive stress film with respect to the substrate can be combined with the tensile stress film with respect to the substrate to form the film by considering the internal stress.

However the film may become a polycrystalline film depending on the material and the thermal process temperature. In such a case, it may be difficult to realize a uniform and a stable internal stress in the film because the internal stress changes depending on grain size of the polycrystalline. On the contrary, when the amorphous material is used, the internal stress becomes uniform. Therefore, it is preferable to use a material suitable for a semiconductor manufacturing process such as $SiO_x$, $Si_xN_y$, $Si_xO_yN_z$ (x, y, z are certain positive integers).

Furthermore, since the $SiO_2$ film 14 has a great adhesion, the film structure can be stable by forming adjacent to the heater layer 7. Since the $Si_3N_4$ film 13 has a great moisture-proof characteristic, it can protect the $SiO_2$ film 14 formed inside from moisture to enhance the moisture-proof characteristic as the whole. Even when the airflow sensor 1 having the thin film heater portion 4 is arranged in a portion at which includes moisture, it can achieve a great effect in an environment-proof characteristic point of view.

Figure 6B:
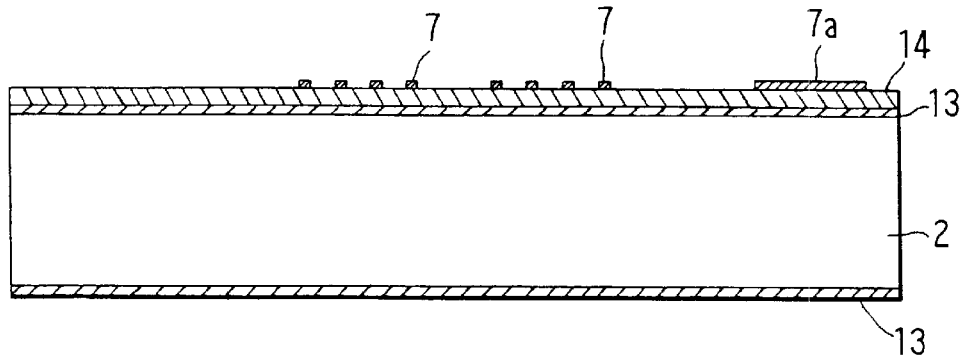

As shown in FIG. 6B, platinum (Pt) film to be the heater layer 7 having approximately 200 nm is formed by vapor deposition at 200° C. Here, it is preferable to form the heater layer 7 by a single layer rather than multi layer from a viewpoint of influence against thermal changes or from a stress distribution. Practically, it is preferable to form a thin titanium (Ti) layer as a bonding (adhesion) layer to enhance the adhesion between the Pt film and the $SiO_2$ film 14 before forming the Pt layer. Hence, Pt/Ti layer is formed as the heater layer 7. It is preferable to set the thickness of the Ti layer to 5–10 nm when the thickness of the Pt layer is 100–500 nm.

After that, unneeded portion of the deposited Pt layer is partly removed by photolithography process in order to pattern the heater layers 7 of each of the thin film heater portion 4 and the temperature sensor 5. In this case, electrode pads 7a of the heater layer 7 are formed at a peripheral portion of an upper surface of the monocrystalline silicon substrate 2. After that, a thermal process (anneal) is performed in the nitrogen atmosphere for the predetermined time at 750° C.

Figure 6C:
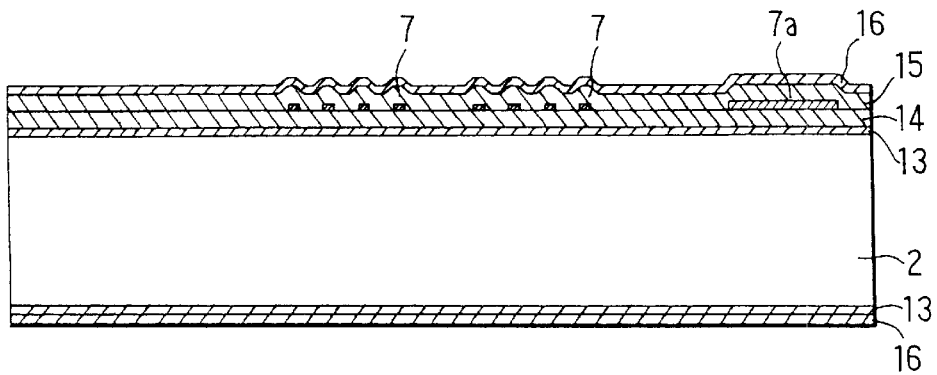

Next, as shown in FIG. 6C, a $SiO_2$ film 15 having a thickness of 1.0 μm is deposited on a surface, where the heater layer 7 is formed, by using the plasma CVD. Here, the substrate temperature is approximately 200° C. After that, a high temperature thermal process is performed to stabilize the film quality of the $SiO_2$ film 15. Here, the thermal process is performed under nitrogen atmosphere for a predetermined time. Similarly, the temperature of the thermal process is set to a predetermined temperature, which is the same as that of a thermal process performed later, that is approximately 750° C. This temperature condition can prevent the internal stress of the $SiO_2$ film 14 from changing during another thermal process performed later.

Next, a $Si_3N_4$ film 16 having a thickness of 0.15 μm is deposited by LPCVD. The substrate temperature is set to 750° C. These conditions of film-forming are set to the same conditions as those of the forming of the lower thin film 6. Therefore, the stress distributions and the warpage moments of both of the lower thin film 6 and the upper thin film 8 are symmetry set each other respectively with respect to the heater layer 7. Hence, the stress can be released and therefore the warpage can be restricted.

Figure 6D:
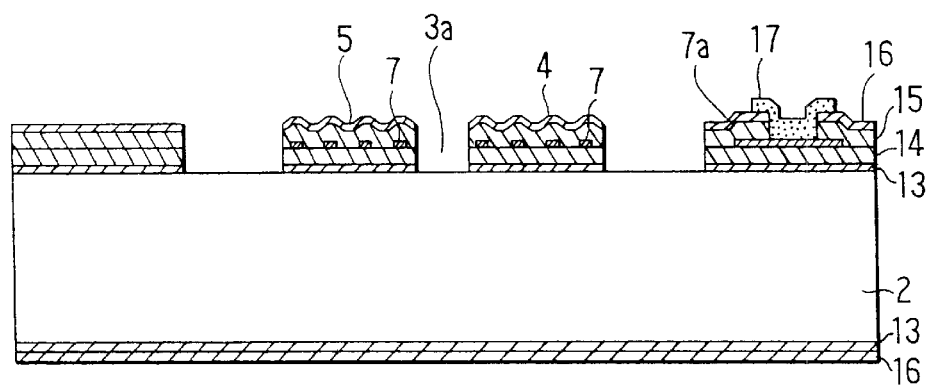
Figure 6E:
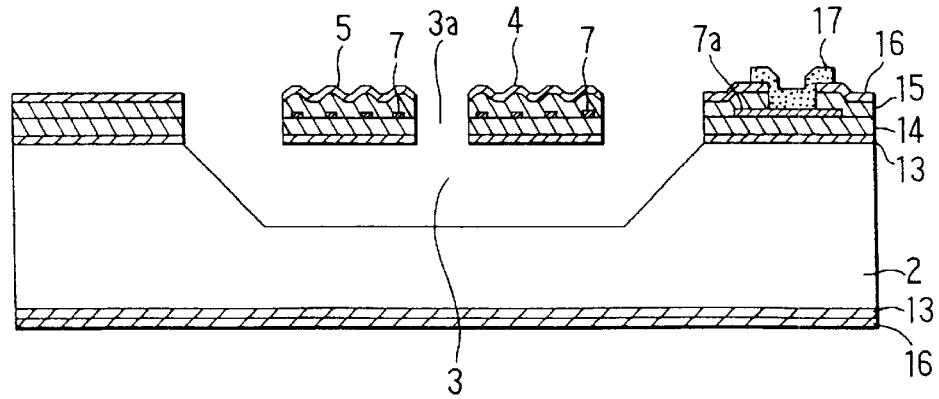

As shown in FIG. 6D, the upper thin film 8 and the lower thin film 6 are partly removed by etching using the photolithography to pattern them to predetermined shapes. By this process, the thin film heater portion 4 and the temperature sensor 5 are divided. Here, an opening portion 8a is formed in the $SiO_2$ film 15 as the upper thin film 8 where the electrode pad 7a exist to make a contact. After that, an Au film having a thickness of 500 nm as a protection film 17 is formed on the entire surface of the substrate 2 by deposition or the like to prepare an etching at a forming process of the hollow portion 3. The Au film is partly removed to remain a portion corresponding to the electrode pad 7a and to remove the other portions so as to pattern the Au film.

Finally, the hollow portion 3 is formed so that the thin film heater portion 4 and the temperature sensor 5 become bridge-shape, by performing an anisotropic etching using etchant such as TMAH solution from a main surface side of the monocrystalline silicon substrate 2 through the portion patterned to the predetermined shape. As a result, the thin film heater portion 4 and the temperature sensor 5 become bridge-shape structure bridged over the hollow portion 3.

According to this embodiment, firstly, the thin film heater portion 4 is constructed by sandwiching the heater layer 7 with the lower thin film 6 and the upper thin film 8, both of which are made of the silicon nitride (Si₃N₄) film as the tensile stress film and the silicon oxide (SiO₂) film as the compressive stress film. It can prevent the internal stress from increasing by releasing the internal stress even when the thickness of the film structure is increased, and can increase the mechanical strength so as to prevent the breakage of the film structure.

Secondly, since the film material and the thickness of the films constituting the lower thin film 6 and the upper thin film 8 are symmetry formed with respect to the heater layer 7, it can adjust the thin film heater portion 4 so that the internal stress causing the domed warpage or the dished warpage is cancelled with each other. Therefore, the film structure will hardly warp as the whole.

Thirdly, since the SiO₂ films 10, 11 as the compressive stress film are provided adjacent to the heater layer 7, the adhesion between these films 10, 11 and the heater layer 7 can be improved by using the bonding layer; and since the Si₃N₄ films 9, 12 are used as the tensile stress film, the airflow sensor 1 can perform a great environment-proof characteristic even when the airflow sensor 1 detects an amount of air containing much moisture. Furthermore, this film structure can be manufactured by using silicon-based manufacturing process without applying any special processes.

The present invention is not limited to the above-described embodiment, but can be modified or expanded as follows, for example.

A silicon carbide (SiC) substrate, a glass substrate, a ceramic substrate or the like may be used as the substrate instead of the monocrystalline silicon substrate 2.

A compound film, which is a compound of silicon and oxide or silicon and nitride, such as $SiO_x$, $Si_xN_y$, $Si_xO_yN_z$, (x, y, z are certain integers) may be used as the compressive stress film or the tensile stress film.

A material for forming the heater layer 7 can be selected from a group of Si, NiCr, TaN, SiC, W and so on.

The bonding layer for the heater layer 7 may be made of another material having adhesive function other than the Ti film. Furthermore, the bonding layer may be omitted when the heater layer 7 is directly bonded with a base layer (the lower thin film 6 or the upper thin film 8).

It is not necessary to construct the lower thin film 6 and the upper thin film 8 to have completely symmetric relation each other. The lower thin film 6 and the upper thin film 8 may be formed to have different number of films, different thickness, or different materials, as long as a combination of which the internal stress of each thin film can be released and the warpage can be cancelled.

Furthermore, at least one of the compressive film and the tensile stress film may be formed by plural layers as long as the internal stress can be released and the warpage can be cancelled as the whole. In this case, an order of arrangement of the films may be changed.

The materials of the lower thin film 6 and the upper thin film 8 are not limited to the amorphous materials, but may be made up of polycrystalline materials. However, the stability of the internal stress of the film made of the amorphous material may be greater than that of polycrystalline material.

The protection layer (etching protection film) 17 may be omitted, when the heater layer 7 is made of a material having durability for a silicon-etching.

The thin film heater portion 4 of the micro-heater is applicable to a diaphragm type in which the hollow portion 3 is covered with a thin film portion instead of a bridge type in which a thin film portion is bridged over the hollow portion 3.

The hollow portion 3 may be formed to have a through hole from main surface side to a back surface side of the monocrystalline silicon substrate 2 instead of depression structure of this embodiment.

The present invention is applicable to a flow sensor for measuring an amount of fluid such as another gas or liquid or a moisture sensor for measuring moisture, instead of the airflow sensor.

What is claimed is:

1. A micro-heater comprising:
a substrate; and
a thin film heater portion being fixed to the substrate and including:
   a heater layer;
   a first thin film laminated with one surface side of the heater layer, and formed by laminating a plurality of films including a compressive stress film and, a tensile stress film; and
   a second thin film laminated with another surface side of the heater layer so as to sandwich the heater layer with the lower thin film, and formed by laminating a plurality of films including a compressive stress film and a tensile stress film, wherein
the heater layer is laminated at the substantially center portion of the thin film heater portion;
one of the first thin film and the second thin film has an internal stress that warps the thin film heater portion in a domed-shape, and another of the first thin film and the second thin film has an internal stress that warps the thin film heater portion in a dished-shape; and
each of the first thin film and the second thin film respectively has a film structure so that the internal stress for warping the thin film heater portion in the domed-shape and the internal stress that warps the thin film heater portion in the dished-shape cancel each other.

2. The micro-heater of claim 1, wherein:
the number of the compressive stress film constituting the first film is the same as that of the compressive stress film constituting the second film; and
the number of the tensile stress film constituting the first film is the same as that of the tensile stress film constituting the second film.

3. The micro-heater of claim 2, wherein:
the compressive stress film and the tensile stress film constituting the first film are arranged symmetry to the compressive stress film and the tensile stress film constituting the second film with respect to the heater layer.

4. The micro-heater of claim 1 wherein:
each of the first thin film and the second thin film is laminated with the heater layer so that the compressive stress film is positioned at the heater layer side and the tensile stress film is positioned at opposite side of the heater layer.

5. The micro-heater of claim 1, wherein:
a material of the compressive stress film constituting the first film is the same as that of the compressive stress film constituting the second film; and
a material of the tensile stress film constituting the first film is the same as that of the tensile stress film constituting the second film.

6. The micro-heater of claim 1, wherein:
a thickness of the compressive stress film constituting the first film is substantially the same as that of the compressive stress film constituting the second film; and a thickness of the tensile stress film constituting the first film is substantially the same as that of the tensile stress film constituting the second film.

7. The micro-heater of claim 1, wherein:

each of the compressive stress film constituting the first film and the compressive stress film constituting the second film is made of amorphous material; and each of the tensile stress film constituting the first film and the tensile stress film constituting the second film is made of amorphous material.

8. The micro-heater of claim 7, wherein:

both of the compressive stress film constituting the first film and the compressive stress film constituting the second film are made of silicon oxide film; and both of the tensile stress film constituting the first film and the tensile stress film constituting the second film is made of silicon nitride.

9. The micro-heater of claim 8, wherein:

a thickness ratio of a silicon oxide film as the compressive stress film with respect to a silicon nitride film as the tensile stress film (a thickness of the silicon oxide film/a thickness of the silicon nitride film) is set within a range of 5–7.

10. The micro-heater of claim 1, wherein:

the heater layer includes a metallic film made of platinum-based metal and a bonding layer for enhancing an adhesion of the metallic film.

11. A micro-heater comprising :

a substrate; and a thin,film heater portion being fixed to the substrate and including:
  a heater layer;
  a first thin film laminated with one surface side of the heater layer, and formed by laminating a plurality of films including a compressive stress film and a tensile stress film; and
  a second thin film laminated with another surface side of the heater layer so as to sandwich the heater layer with the lower thin film, and formed by laminating a plurality of films including a compressive stress film and a tensile stress film, wherein the compressive stress film and the tensile stress film of the first thin film and the compressive stress film and the tensile stress film of the second thin film releases an internal stress of the thin film heater portion.

12. The micro-heater of claim 11, wherein:

the number of the compressive stress film constituting the first film is the same as that of the compressive stress film constituting the second film; and the number of the tensile stress film constituting the first film is the same as that of the tensile stress film constituting the second film.

13. The micro-heater of claim 12, wherein:

the compressive stress film and the tensile stress film constituting the first film are arranged symmetry to the compressive stress film and the tensile stress film constituting the second film with respect to the heater layer.

14. The micro-heater of claim 11, wherein:

each of the first thin film and the second thin film is laminated with the heater layer so that the compressive stress film is positioned at the heater layer side and the tensile stress film is positioned at opposite side of the heater layer.

15. The micro-heater of claim 11, wherein:

a material of the compressive stress film constituting the first film is the same as that of the compressive stress film constituting the second film; and a material of the tensile stress film constituting the first film is the same as that of the tensile stress film constituting the second film.

16. The micro-heater of claim 11, wherein:

a thickness of the compressive stress film constituting the first film is substantially the same as that of the compressive stress film constituting the second film; and a thickness of the tensile stress film constituting the first film is substantially the same as that of the tensile stress film constituting the second film.

17. The micro-heater of claim 11, wherein:

each of the compressive stress film constituting the first film and the compressive stress film constituting the second film is made of amorphous material; and each of the tensile stress film constituting the first film and the tensile stress film constituting the second film is made of amorphous material.

18. The micro-heater of claim 17, wherein:

both of the compressive stress film constituting the first film and the compressive stress film constituting the second film are made of silicon oxide film; and both of the tensile stress film constituting the first film and the tensile stress film constituting the second film is made of silicon nitride.

19. The micro-heater of claim 18, wherein:

a thickness ratio of a silicon oxide film as the compressive stress film with respect to a silicon nitride film as the tensile stress film (a thickness of the silicon oxide film/a thickness of the silicon nitride film) is set within a range of 5–7.

20. The micro-heater of claim 11, wherein:

the heater layer includes a metallic film made of platinum-based metal and a bonding layer for enhancing an adhesion of the metallic film.

21. An airflow sensor comprising:

a substrate having a hollow portion therein;

a micro-heater being arranged above the hollow portion, comprising:
  a thin film heater portion being arranged above the substrate and including:
    a heater layer;
    a first thin film laminated with one surface side of the heater layer, and formed by laminating a plurality of films including a compressive stress film and a tensile stress film; and
    a second thin film laminated with another surface side of the heater layer so as to sandwich the heater layer with the lower thin film, and formed by laminating a plurality of films including a compressive stress film and a tensile stress film, wherein:

the compressive stress film and the tensile stress film of the first thin film and the compressive stress film and the tensile stress film of the second thin film releases an internal stress of the thin film heater portion; and a temperature sensor being arranged above the hollow portion to be positioned at an upstream of airflow whose amount being to be detected.

22. The airflow sensor of claim 21, wherein:

the heater layer is laminated at the substantially center portion of the thin film heater portion.

* * * * *